| 
US011106252B2

(12) United States Patent
Chung

(10) Patent No.: US 11,106,252 B2
(45) Date of Patent: Aug. 31, 2021

(54) RETAINERS WITH MOVABLE HOOKS

(71) Applicant: Hewlett-Packard Development Company, L.P., Spring, TX (US)

(72) Inventor: Tien Liang Chung, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 118 days.

(21) Appl. No.: 16/341,011

(22) PCT Filed: Dec. 21, 2016

(86) PCT No.: PCT/US2016/067961
§ 371 (c)(1),
(2) Date: Apr. 10, 2019

(87) PCT Pub. No.: WO2018/118036
PCT Pub. Date: Jun. 28, 2018

(65) Prior Publication Data
US 2020/0089288 A1  Mar. 19, 2020

(51) Int. Cl.
*G06F 1/18* (2006.01)
*G06F 1/16* (2006.01)
*H05K 7/00* (2006.01)
*H05K 13/04* (2006.01)
*F16B 35/06* (2006.01)
*H01R 13/62* (2006.01)
*H05K 7/14* (2006.01)
*H05K 1/14* (2006.01)
(Continued)

(52) U.S. Cl.
CPC .............. *G06F 1/185* (2013.01); *F16B 35/06* (2013.01); *H05K 7/142* (2013.01); *F16B 5/0092* (2013.01); *F16B 5/0614* (2013.01); *H01R 12/7029* (2013.01); *H01R 12/721* (2013.01); *H05K 1/141* (2013.01)

(58) Field of Classification Search
CPC .... H05K 7/142; H05K 7/1417; F16B 5/0614; F16B 35/06; F16B 5/0092; G06F 1/185; H01R 12/7029; H01R 12/721
See application file for complete search history.

(56) References Cited

U.S. PATENT DOCUMENTS 5,308,257 A    5/1994  Buchter et al.
5,405,210 A *  4/1995  Tsui ......................... B21K 1/72
                                                   403/119
(Continued)

FOREIGN PATENT DOCUMENTS

CN          2384323       6/2000
CN         202025875      11/2011
(Continued)

*Primary Examiner* — Tan Le
(74) *Attorney, Agent, or Firm* — HP Inc. Patent Department

(57) ABSTRACT

In an example, a retainer may include a post to insertably engage with a post receptacle on a system board, and a hook hingeably attached to the post. The hook may be movable from a first position, lateral to a longitudinal axis of the post, to a second position aligned with the longitudinal axis of the post. In some implementations, the hook may be spaced from a top surface of the post when disposed in the second position so as to receive a portion of an expansion component between the hook and the post when the hook is disposed in the second position.

14 Claims, 5 Drawing Sheets

(51) Int. Cl.
*H01R 12/70* (2011.01)
*F16B 5/06* (2006.01)
*F16B 5/00* (2006.01)
*H01R 12/72* (2011.01)

(56) References Cited

U.S. PATENT DOCUMENTS

| | | |
|---|---|---|
| 5,516,304 A | 5/1996 | Yu |
| 5,924,886 A | 7/1999 | Achammer et al. |
| 6,215,668 B1 * | 4/2001 | Hass ............... G06F 1/184 |
| | | 24/553 |
| 6,449,157 B1 | 9/2002 | Chu |
| 6,530,629 B2 | 3/2003 | Shyr |
| 6,576,847 B2 | 6/2003 | Marketkar et al. |
| 6,884,100 B1 | 4/2005 | Hsiao |
| 6,905,357 B2 | 6/2005 | Ma |
| 7,245,496 B1 | 7/2007 | Luo et al. |
| 7,359,192 B2 | 4/2008 | Yang et al. |
| 7,661,974 B1 * | 2/2010 | Sun ................ H05K 7/1431 |
| | | 439/328 |
| 7,672,136 B2 | 3/2010 | He et al. |
| 8,424,638 B1 * | 4/2013 | Guthrie ........... A62B 35/0068 |
| | | 182/3 |
| 8,524,097 B2 * | 9/2013 | Garlough ............. C09J 5/02 |
| | | 216/33 |
| 9,222,615 B2 | 12/2015 | Wiersma et al. |
| 2006/0160424 A1 | 7/2006 | Korsunsky et al. |
| 2007/0238323 A1 | 10/2007 | Mathews et al. |
| 2013/0058054 A1 * | 3/2013 | Zhou ................. G06F 1/185 |
| | | 361/748 |
| 2014/0106604 A1 | 4/2014 | Chen |
| 2015/0318627 A1 | 11/2015 | Berry, Jr. et al. |

FOREIGN PATENT DOCUMENTS

| | | |
|---|---|---|
| CN | 103163985 | 6/2013 |
| CN | 103324254 | 9/2013 |

* cited by examiner

RETAINERS WITH MOVABLE HOOKS

BACKGROUND

Devices such as electronic devices may have system boards, motherboards, or other types of circuit boards. System boards may include electronic device components, including expansion connectors, sometimes referred to as expansion slots. Expansion slots may interface and engage with various accessories or expansion components that a user may want to connect to the electronic device in order to enhance the performance or capabilities of the electronic device. Expansion components may include, but are not limited to, storage devices or storage device arrays, network cards, audio cards, graphics cards, or other types of expansion cards.

DETAILED DESCRIPTION

Figure 1:
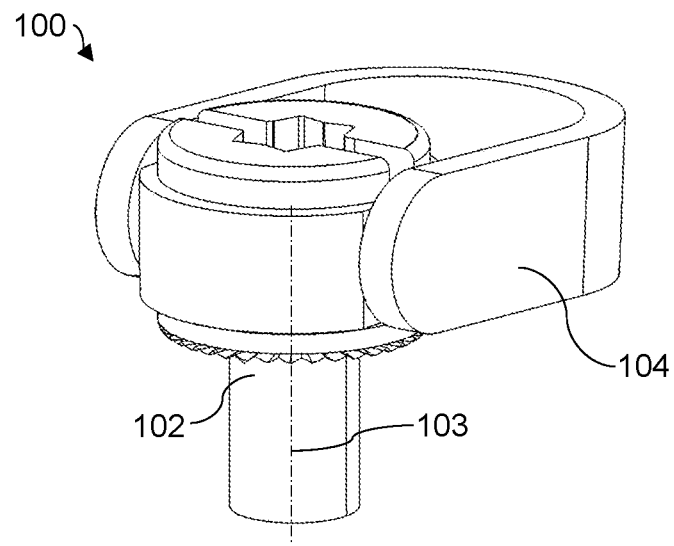
FIG. 1A is a perspective view of an example retainer.

Devices such as electronic devices may have system boards, motherboards, or other types of circuit boards. System boards may include electrical or computing components such as processors, memory, electrical pathways, or other suitable components for use in an electronic device. System boards may also include expansion connectors, sometimes referred to as expansion slots. Expansion slots may receive, interface with, and/or engage with various accessories, sometimes referred to as expansion components, and operably engage such expansion components with the system board so as to increase the performance or capabilities of the electronic device. Expansion components may include, but are not limited to, storage devices or storage device arrays, network cards, audio cards, graphics cards, or other types of expansion cards or components.

In some situations, expansion components may attach to the system board by being inserted into an expansion slot, or a connector thereof, that is disposed on the system board, and/or operably engaged therewith. Such a single point of attachment may result in an insecure or unstable physical or mechanical connection between the expansion component and the system board. In situations where the expansion component may be heavy or large, such a weak attachment between the expansion component and the expansion slot may enable the expansion component to become partially or fully disconnected from the expansion slot, and, further, may even result in the expansion component inadvertently falling out of, or otherwise being removed from the expansion slot.

The connection or physical engagement of an expansion component and an expansion slot may sometimes be further secured or supplemented by a bracket or brace physically reinforcing the expansion component from the top or sides, and ensuring a secure and/or tight connection with the expansion slot. Such brackets or braces may increase the cost and complexity of the system board and/or the electronic device. Additionally, such brackets or braces may not universally fit a range of expansion components, thereby necessitating the use of a different bracket or brace corresponding with the specific expansion component being engaged with the electronic device.

Implementations of the present disclosure provide retainers with a movable hook that may reinforce and secure the engagement of an expansion component with an expansion slot of an electronic device. Further, implementations of the present disclosure may provide retainers that may be utilized with multiple different types and/or sizes of expansion components and expansion slots, eliminating the need to have specific brackets or braces that correspond to specific expansion components. Additionally, implementations of the present disclosure may provide retainers that securely engage with the system board or another portion of the electronic device so as to be reliably and securely anchored to the electronic device or the system board thereof, and so as to provide a secure retention force to the expansion component.

Referring now to FIG. 1, a perspective view of an example retainer 100 is illustrated. The example retainer 100 may include a post 102 to insertably engage with a post receptacle on a system board, and a hook 104 hingeably attached to the post 102. The hook 104 may be movable from a first position, lateral to a longitudinal axis 103 of the post 102, to a second position aligned with the longitudinal axis 103 of the post 102. The implementation of the retainer 100 illustrated in FIG. 1 shows the hook 104 disposed in the first position. In some implementations, the hook 104 may be spaced from a top surface of the post 102 when disposed in the second position so as to receive a tail of an expansion component or expansion card between the hook 104 and the post 102 when the hook 104 is disposed in the second position.

Figure 2:
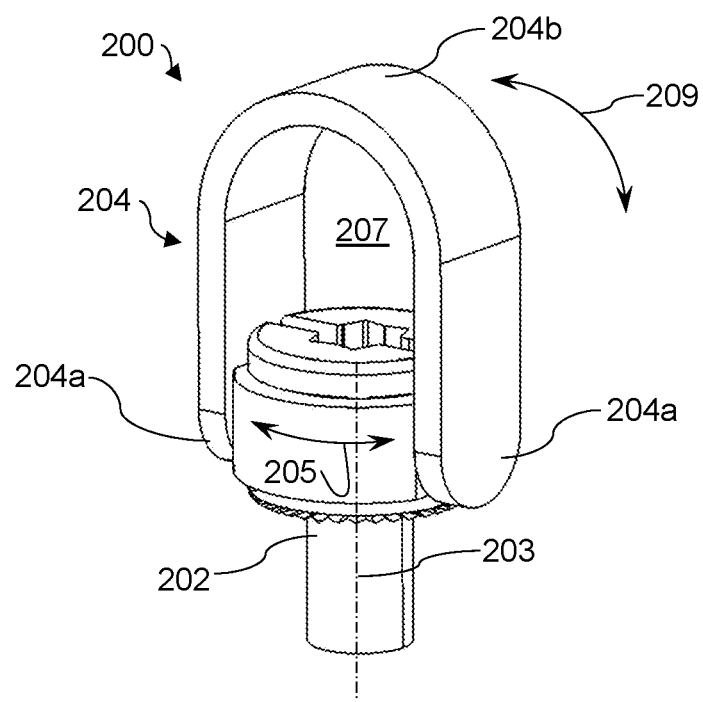
FIG. 2 is a perspective view of an example retainer.

Referring now to FIG. 2, a perspective view of an example retainer 200 is illustrated. Example retainer 200 may be similar to example retainer 100. Further, the similarly-named elements of example retainer 200 may be similar in function and/or structure to the elements of example retainer 100, as they are described above. Example retainer 200 may include a post 202 and a hook 204, which may be similar to the post 102 and the hook 104 described above. The post 202, in some implementations, may be an elongate member, and may be rigid, or semi-rigid. In further implementations, the post 202 may have a barrel-like, or a shaft-like structure. In some implementations, the post 202 may have a screw or fastener-like structure. The hook 204, may be a rigid or semi-rigid member that is movably, pivotably, or hingeably engaged with the post 202 and movable between a first position and a second position. The hook 204 may have a U-shaped structure, in some implementations, and may attach to the post 202 at both of two end portions 204a of the hook 204. In further implementations, the hook 204 may have a V-shaped structure, or another structure having a loop portion 204b and two end portions 204a. The loop portion 204b may be a portion of the hook 204 that is spaced away from the post 202, or a portion thereof, when the hook 204 is disposed in the second position. In some implementations, such a space between the hook 204 and the post 202 may resemble an aperture, cavity, or another type of enclosed space similar to that identified by element 207 of FIG. 2. In some implementations, the hook 204 may have an elongate structure resembling that of a beam, shaft, or another elongate geometry, and may be formed by bending the elongate structure back on itself to define the loop portion 204b and the two end portions 204a. In some implementations, the hook 204 may have only one end portion 204a that attaches to the post 202, leaving the second end portion 204a as a free end, wherein the loop 204b resembles a J-hook, L-hook, or another hook-like shape.

The hook 204 may be pivotable or otherwise movable from the first position to the second position, with the hook 204 illustrated as being disposed in the second position in FIG. 2. Further, the hook 204 may be movable between the first and second positions along a direction similar to that of example direction 209, in some implementations. The engagement or attachment of the hook 204 to the post 202 may be through a pivot point at one or both of the end portions 204a, about which the hook 204 may move or pivot between the first and second positions. The hook 204 may be disposed orthogonally to, normal to, substantially perpendicular to, or otherwise laterally to a longitudinal or central axis 203 of the post 202 when the hook 204 is disposed in the first position. Further, the hook 204 may be disposed substantially parallel to, aligned with, or otherwise disposed along the longitudinal axis 203 when the hook 204 is disposed in the second position, as illustrated in FIG. 2. In some implementations, the hook 204 may be movably attached to or engaged with the post 202 such that the hook 204 is movable about the longitudinal axis 203, for example, along direction 205. The hook 204 may be movable in such a manner about the longitudinal axis 203 if the hook 204 is disposed in either of the first or second positions, or if the hook 204 is disposed in between the first and second positions.

Figure 3:
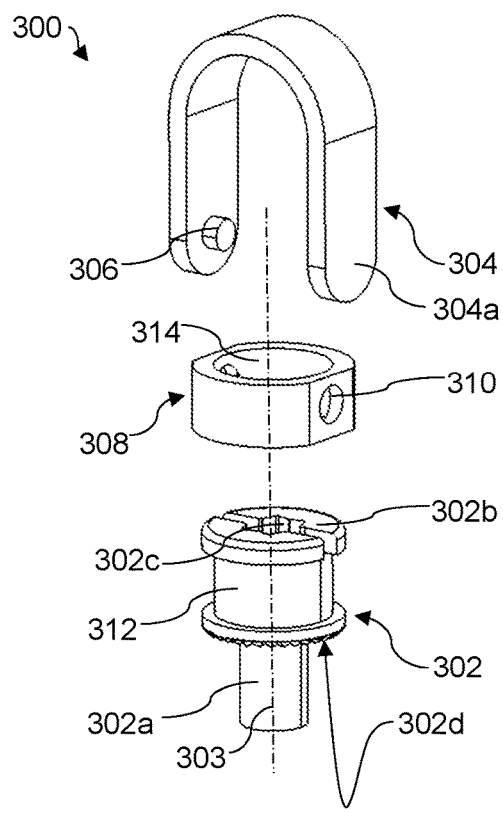
FIG. 3 is an exploded perspective view of an example retainer.

Referring now to FIG. 3, an exploded perspective view of an example retainer 300 is illustrated. Example retainer 300 may be similar to any of the above-described example retainers. Further, the similarly-named elements of example retainer 300 may be similar in function and/or structure to the elements of the other example retainers, as they are described above. The example retainer 300 may further include a collar 308. The collar 308 may be a rigid or semi-rigid member or element that may have an annular structure similar to a ring, circular band, donut, tube, or another geometry having a central bore 314. In some implementations, the collar 308 may be disposed on an axle 312 of the retainer 300. In further implementations, the axle 312 may be considered as being a part of or sub-component of a post 302 of the retainer 300. In some implementations, the collar 308 may be rotatably engaged with the post 302 by way of the engagement of the central bore 314 with the axle 312. Further, the collar 308 may be engaged with the post 302 so as to be rotatable about a longitudinal axis 303 of the post 302.

In some implementations, the collar 308 may movably engage a hook 304 with the post 302. The collar 308 may include a pivot bore 310, which may be a cavity, aperture, or opening in the collar 308 to receive a complementary pivot post 306 of the hook 304. In some implementations, the pivot bore 310 may extend through the thickness of the collar to the central bore 314. The pivot post 306 may be a barrel, shaft, or another type of protrusion that may extend inwards from the hook 304, or an end portion 304a thereof. In some implementations, the pivot post 306 may be a unitary part of the hook 304, and, in other implementations, the pivot post 306 may be a separate component that may be assembled on to or attached to the hook 304. In further implementations, the pivot post 306 may be a screw, pin, or another type of fastener. The pivot bore 310 and the pivot post 306 may each be sufficiently sized and have a complementary structure so that the pivot post 306 may rotate or pivot within the pivot bore 310, relative to the collar 308.

In some implementations, the collar 308 may include two pivot bores 310, each to receive one of two pivot posts 306 disposed on the hook 304. Each pivot post 306 may be disposed on a separate end portion 304a of the hook 304, in further implementations. Additionally, each pivot post 306 may be disposed opposite to one another and extend from the hook 304 inwards towards one another to be received in two complementary oppositely-disposed pivot bores 310 disposed on the collar 308. In some implementations, the pivot bores 310 may receive the pivot posts 306 such that the collar 308 may receive the hook 304 and hingeably engage the hook 304 with the post 302 such that the hook 304 is pivotable laterally to and axially about the longitudinal axis 303 of the post 302. Stated differently the hook 304 may be hingeably attached to the collar 308, and the collar 308 may be rotatably attached to the post 302 and movable about the longitudinal axis 303.

The post 302 may further include an engagement portion 302a, and a top surface 302b. The engagement portion 302a may extend from the post 302 in a direction that may be away from opposite from the top surface 302b. The engagement portion 302a may be a portion of the post 302 that may attach to, insert into, or otherwise engage with a post receptacle of a system board. In some implementations, the engagement portion 302a may include threads or a threaded portion to engage with complementary threads of or within the post receptacle.

In further implementations, the post 302 may further include a tool slot 302c. The tool slot 302c may be a cavity or aperture extending into the top surface 302b of the post 302. In some implementations, the tool slot 302c may have an elongate slot geometry, a crossed-slot or Phillips-head geometry, a 6-lobed star or Torx geometry, a square geometry, a six-sided hex or Allen geometry, or another geometry that may be complementary to, and sized sufficiently to receive, a common mechanical tool or driver. Such a tool slot 302c may receive a mechanical tool and may transfer torque from the mechanical tool to the engagement portion 302a so as to engage the post with the post receptacle, for example, by threading the post into the post receptacle. In some implementations, the engagement portion 302a may include male threads to engage with complementary female threads of the post receptacle, or, in other implementations, the engagement portion 302a may include female threads to engage with complementary male threads of the post receptacle. In yet further implementations, the post 302 may further include a friction portion 302d to engage with a mating surface into which the retainer 300, or post 302 thereof is inserted or engaged. Such a friction portion 302d may include knurling, or other friction-inducing geometry or protrusions to engage with the mating surface and resist or prevent the post 302 from rotating in a loosening fashion relative to such a mating surface. The mating surface, in some implementations, may be a surface of a system board, for example, into which the post 302 is engaged with the post receptacle.

Figure 4A:
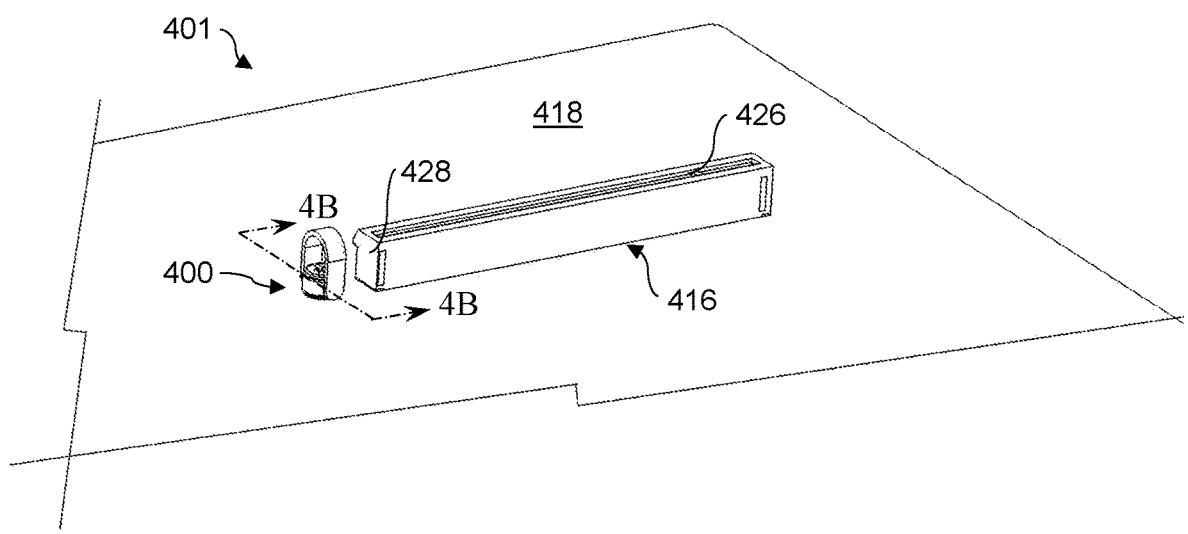
FIG. 4A is a perspective view of a device assembly having an example retainer.

Referring now to FIG. 4A, a perspective view of an example device assembly is illustrated, wherein the device assembly includes an example retainer 400. The device assembly may be a system board assembly 401, in some implementations. Example retainer 400 may be similar to any of the above-described example retainers. Further, the similarly-named elements of example retainer 400 may be similar in function and/or structure to the elements of the other example retainers, as they are described above. In some implementations, the system board assembly 401 may be a circuit board assembly. In further implementations, the system board assembly 401 may be a system board assembly of an electronic device, or, specifically, a computing device in other implementations. Such a computing device may be a laptop or desktop computing device, or an all-in-one computing device in some implementations, and may include components such as processors, memory, storage drives, graphics or audio cards, displays, and other components suitable for use in a computing device.

The system board assembly 401 may include a system board 418. The system board 418 may structurally support and electrically connect multiple electronic components. The system board 418 may, in some implementations, connect multiple electronic components with conductive pathways, which, in further implementations, may include copper. In yet further implementations, the system board 418 may be made at least partially out of a non-conductive substrate with copper pathways etched onto the substrate. In some implementations, the non-conductive substrate may include silicon. In further implementations, the system board 418 may be or may include a circuit board, or a single-layer printed circuit board (PCB), or a multi-layer PCB in other implementations. The system board 418, or the system board assembly 401, further, may be a printed circuit assembly (PCA) including one or more of expansion slots, processors, Random Access Memory (RAM), optical, magnetic, or solid state storage devices, heat sinks, cooling fans, and other traditional computer and electrical components. The system board assembly 401 may further include a main system bus, as well as an expansion bus for the transfer of data. In some implementations, the system board 418 and the configuration of the components thereon may comply with Advanced Technology eXtended (ATX), Micro ATX, Embedded Platform Integrated Architecture (EPIA), Balanced Technology eXtended (BTX), or other system board size and configuration standards. In some implementations, the system board assembly 401 may be a mother board and associated electronic components of a computing device.

The system board assembly 401 may include an expansion connector 416, sometimes referred to as an expansion slot 416, disposed on the system board 418, or a first side thereof. The expansion slot 416 may be an electrical connector, or may have an electrical connector, which may be referred to as a board connector 426, which may have multiple electrical contacts, including signal, power, and ground contacts. The signal, power, and ground contacts may be connected to signal circuits, power circuits, and ground circuits, respectively, of the system board assembly 401. The expansion slot 416 may engage with or receive a complementary card connector, sometimes referred to as an edge connector, of an expansion component or expansion card, in a connected position. The card connector may have multiple complementary contacts to engage with the multiple electrical contacts of the board connector 426. The expansion slot 416 may be electrically engaged with an expansion bus disposed on the system board assembly 401, the expansion bus to enable data transfer between the expansion component or expansion card engaged with the expansion slot 416 and a main system bus disposed on the system board assembly 401. In some implementations, the expansion slot 416 may be a two-way serial connector. In further implementations, the expansion slot 416 may be a Peripheral Component Interconnect (PCI) slot, an Accelerated Graphics Port (AGP) slot, a Peripheral Component Interconnect Express (PCIe) slot, or another type of computer bus standard slot.

In some implementations, the system board assembly 401 may include an example retainer 400. The retainer 400 may include a post 402 and a hook 404. The retainer 400 may be disposed at a distal end 428, or adjacent to such distal end 428, of the expansion slot 416. The distal end 428 may be an end of the expansion slot 416 that is disposed at the end of a length of the board connector 426. As such, if an expansion card is attached to or engaged with the expansion slot 416, the retainer 400 may be disposed such that it may engage with or latch on to a feature of the expansion card that may be disposed at a far end of a card connector of the expansion card.

Figure 4B:
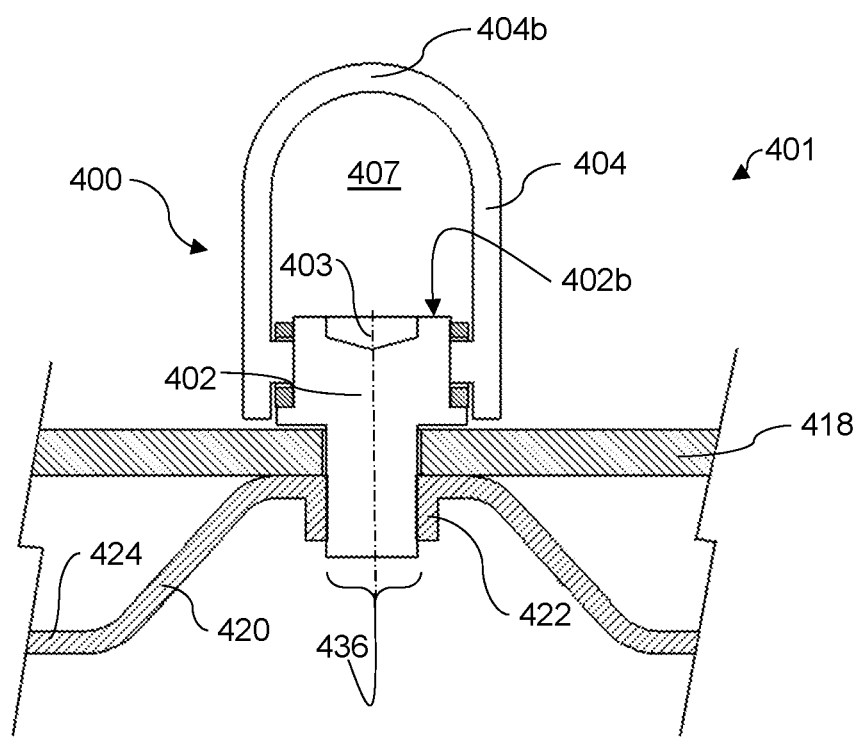
FIG. 4B is a cross-sectional view of device assembly having an example retainer.

Referring additionally to FIG. 4B, a cross-sectional view of the system board assembly 401 is illustrated. The retainer 400 may be engaged with the system board 418 such that the retainer is anchored to the system board 418, or the first side thereof. More specifically, in some implementations, the post 402 of the retainer 400 may insertably engage with a post receptacle 436 on the system board 418. The post receptacle 436 may be a cavity, or aperture to receive the post 402 of the retainer 400. In further implementations, the post 402, or an engagement portion thereof, may include threads to engage with complementary threads of the post receptacle 436 of the system board 418. As such, the retainer 400, or the post 402 thereof, may be threadably inserted into the post receptacle 436 and tightened such that the retainer 400 is anchored or fixed to the first side of the system board 418. In some implementations, the retainer 400 may be threadably inserted into the post receptacle 436 by a tool engaged with a tool slot of the retainer 400, or the post 402 thereof. In further implementations, the post 402 may be insertable into the post receptacle 436 along a longitudinal axis 403 of the retainer 400, or the post 402 thereof, such that the post 402 is to anchor the retainer 400 to the system board 418 when disposed within the post receptacle 436. In some implementations, the retainer 400 may be engaged with the post receptacle 436 of the system board 418 at the distal end 428 of the expansion slot 416.

In some implementations, the system board assembly 401, or a computing device including the system board assembly 401, may include a board substrate 424 disposed adjacent to the system board 418. In further implementations, the board substrate 424 may be disposed on an opposite side of the system board 418 from the expansion slot 416, or, in other words, the board substrate 424 may be disposed against or along a second side of the system board 418, which may be an opposite side from the first side of the system board 418. Further, the board substrate 424 may be a tray to which the system board 418 is fastened or assembled within the computing device. In some implementations, the post 402 may insertably engage with the board substrate 424 to anchor the retainer 400 to the system board 418. In some implementations, the board substrate 424 may include a boss 420, sometimes referred to as a standoff, which may extend from the board substrate 424 to the system board 418, or the second side thereof, thereby spanning a gap therebetween. The boss 420 may include a threaded portion 422 to engage with the post 402, or threads thereon. In other words, the post 402 may threadably engage with the boss 420 of the board substrate 424 to anchor the retainer to the system board 418 in further implementations. In such implementations, the system board 418 may include a through-hole extending from the first side of the system board 418 through the thickness of the system board 418 to the second side of the system board 418. The retainer 400, or the post 402 may be inserted into the through-hole such that the post 402 may engage with the threaded portion 422 of the board substrate 424 in order to anchor the retainer 400 to the system board 418. In other implementations, the post 402 may engage with the system board 418 or another component in a different manner in order to anchor or retain the retainer 400 to the system board 418, or the first side thereof. For example, the post 402, in some implementations, may engage with threads of the post receptacle 436 that may be disposed through the thickness of the system board 418, instead of on another component. In yet other implementations, the post 402 may engage with a nut or another mechanical fastener in order to anchor the retainer 400 to the system board 418. In other implementations, the post 402 may be press fit into the post receptacle 436.

In some implementations, the hook 404 of the retainer 400 may include a loop portion 404b. The hook 404 may be movable between a first position and a second position, in some implementations, with the second position being illustrated in FIGS. 4A-4B. The first position may also be referred to as a released position, while the second position may also be referred to as a latched position. The hook 404 may define a space or cavity 407 in between the loop portion 404b and the post 402, or a top surface 402b thereof, if the hook 404 is disposed in the latched position. Such a space or cavity is illustrated in FIG. 4B.

Figure 5A:
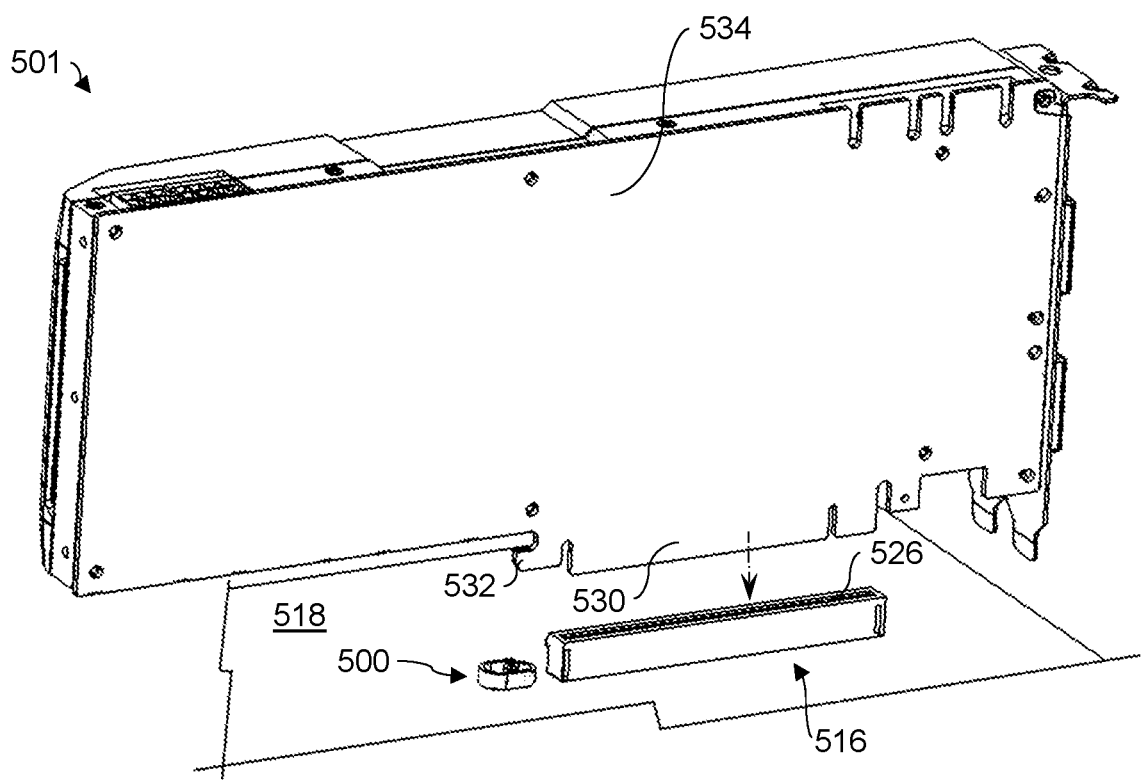
FIG. 5A is a perspective view of a computing device having an example retainer.

Referring now to FIG. 5A, a perspective view of an example computing device 501 having an example retainer 500 is illustrated. Example retainer 500 may be similar to any of the above-described example retainers. Further, the similarly-named elements of example retainer 500 may be similar in function and/or structure to the elements of the other example retainers, as they are described above. Computing device 501 may include a system board assembly having a system board 518. Further, the computing device 501 may include an expansion component, which may be an expansion card 534, and an expansion slot 516. The expansion slot 516 may be operably disposed on the system board 518 and may receive the expansion card 534. The expansion card 534, in some implementations, may be an electronic or computing component that may enhance or improve the performance or capabilities of the computing device if the expansion card 534 is operably engaged with the computing device 501, for example, by being fully or operably connected to the expansion slot 516. In further implementations, the expansion card 534 may be an audio card, a network card, a graphics card, or a doublewide graphics card. In other implementations, the expansion card 534 may be another type of card or expansion component. In some implementations, the expansion card 534 may have an electrical connector 530, referred to as a card connector 530. The card connector 530 may electrically and mechanically engage with a board connector 526 of the expansion slot 516 in order to fully connect or operably engage the expansion card 534 with the computing device 501 in a connected position. In further implementations, the card connector 530 may insert into or engage with the board connector 526 in a normal, perpendicular manner, or in a manner lateral to a first side of the system board 518, as illustrated in FIG. 5A.

The computing device 501 may also include the retainer 500 attached to the system board 518. The retainer 500 may include a hook 504 and a post 502 and may engage with a portion of or a tail 532 of the expansion card 534 to retain the expansion card 534 within the expansion slot 516. The post 502 may anchor the retainer 500 to the system board 518, and the hook 504 may be hingeably engaged with the post 502 through a rotatable collar and may be movable between a released position, illustrated in FIG. 5A, and a latched position, illustrated in FIG. 5C. In some implementations, the hook 504 may be aligned with the system board 518 when disposed in the released position, and may be lateral to the system board 518 when disposed in the latched position.

Figure 5B:
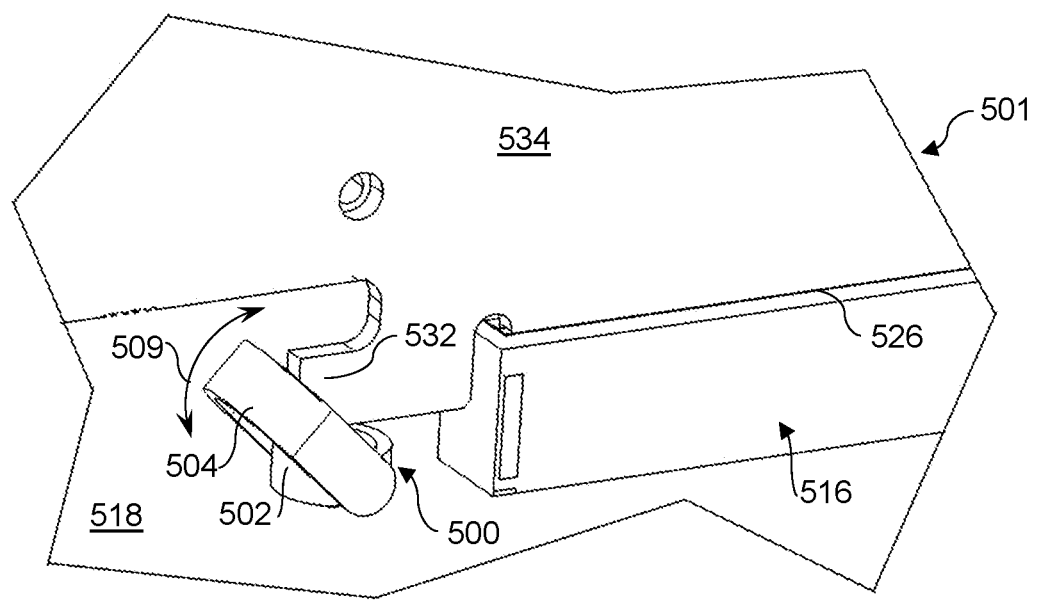
FIG. 5B is a detail perspective view of a computing device having an example retainer.
Figure 5C:
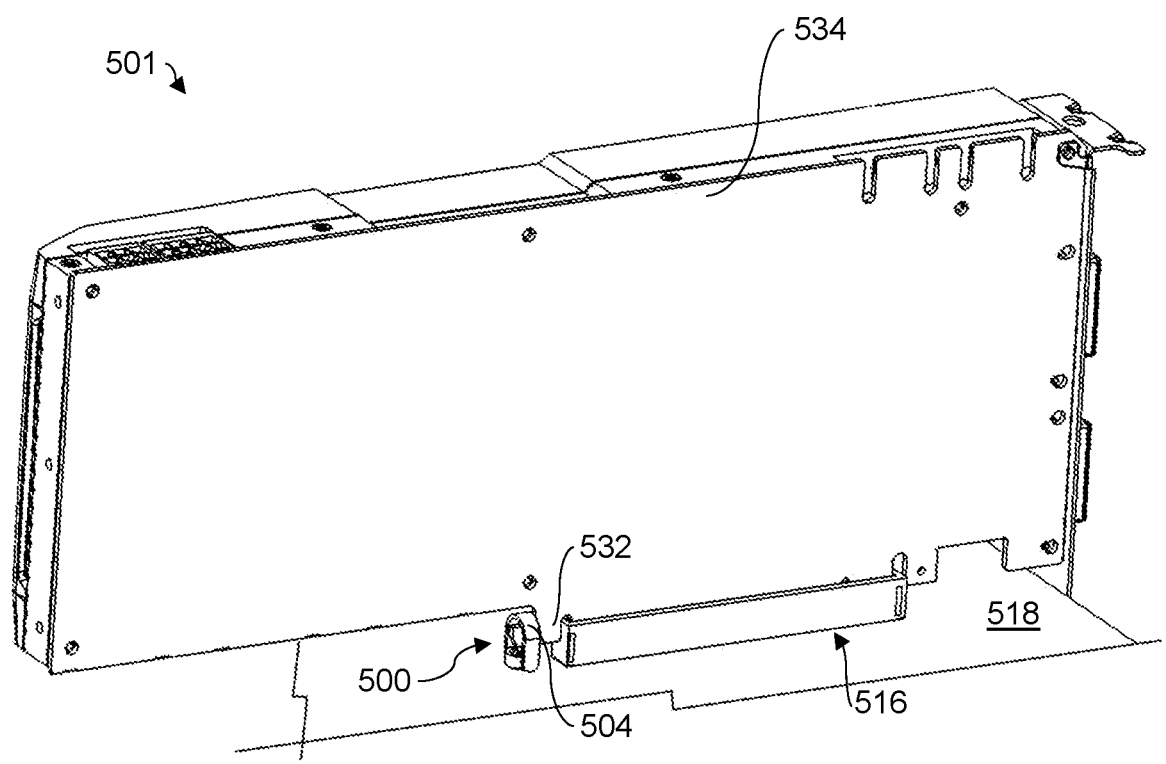
FIG. 5C is a perspective view of a computing device having an example retainer.

Referring additionally to FIGS. 5B-5C, a detail perspective view of the example computing device 501 is illustrated wherein the card connector 530 has fully engaged with the board connector 526, and, thus, the expansion card 534 is operably engaged with the computing device 501, and/or the expansion slot 516 thereof. Note, the card connector 530 is not shown in FIG. 5B, as it may be disposed within the expansion slot 516, or the board connector 526 thereof and may not be visible. The expansion card 534 may further include the tail 532, which may extend from the expansion card 534. In some implementations, the tail 532 may be disposed at a distal end or a far end of the card connector 530, and may extend from the expansion card 534 in a direction parallel to or otherwise along the longitudinal direction of the card connector 530. The tail 532, or a feature having a similar structure, may be a standard feature found on a variety of expansion components or expansion cards. Further, if the expansion card 534 is operably engaged with the expansion slot 516, the tail 532 may be disposed sufficiently close to or aligned with the retainer 500 such that the retainer 500 may engage with or latch on to the tail 532. More specifically, the hook 504 of the retainer 500 may be able to move or pivot relative to the post 502 so as to swivel or pivot in a direction lateral to the first side of the system board 518, or a planar geometry thereof, and move from the released position shown in FIG. 5A to the latched position shown in FIG. 5C. Note, FIG. 5B illustrates the hook 504 as it is being transitioned between the released and the latched positions. More specifically, the hook 504 may be transitioned from the released position, wherein the hook 504 is aligned with a first side of the system board 518 or a planar geometry of the system board 518, along direction 509 to the latched position, wherein the hook 504 is disposed in a position lateral to or perpendicular to a planar geometry of the system board 518. The hook 504 may engage with or latch on to the tail 532 of the expansion card 534 when disposed in the latched position. In other words, the tail 532, or a portion thereof, may be disposed in a space in between the hook 504, or a loop portion thereof, and the post 502, or a top surface thereof. The hook 504 may latch on to the tail 532 to retain the tail 532, and thus the expansion card 534, to the system board 518 if the hook 504 is disposed in the latched position and the card connector 530 is fully engaged with the board connector 526. Stated differently, if disposed in the latched position and engaged with the tail 532, the retainer 500, or the hook 504 thereof, may retain the expansion card 534 in a fully or operably connected position with the expansion slot 516, or the board connector 526 thereof, and further retain the expansion card 534 along a direction aligned with the insertion direction of the card connector 530 into the board connector 526. Stated yet differently, the hook 504 may retain the expansion card 534 to the system board 518 along a direction aligned with a longitudinal axis of the post 502 of the retainer 500. Further, the hook 504 may be disengaged from the tail 532 of the expansion card 534 when the hook 504 is disposed in the released position such that the card connector 530 is removable from the board connector 526. Thus, the retainer 500 may provide a reliable and secure retention mechanism for the expansion card 534 and may prevent the expansion card 534 from inadvertent removal from or disconnection with the expansion slot 516, and thus the system board 518 and/or computing device 501.

What is claimed is:

1. A device assembly, comprising:
a system board having an expansion slot to engage with an expansion card and a post receptacle disposed adjacent the expansion slot; and
a retainer, comprising:
a post insertably engaged with the post receptacle;
a collar engaged with the post so as to be rotatable about a longitudinal axis of the post; and
a hook hingeably attached to the collar such that the hook is pivotable laterally to and axially about the longitudinal axis and movable from a first position lateral to the longitudinal axis of the post to a second position aligned with the longitudinal axis of the post, the hook spaced from a top surface of the post when disposed in the second position so as to receive a tail of the expansion card between the hook and the post when the hook is disposed in the second position.

2. The device assembly of claim 1, wherein the post further comprises threads to engage with complementary threads of the post receptacle of the system board.

3. The device assembly of claim 1, wherein the hook is aligned with the system board when disposed in the first position, and lateral to the system board when disposed in the second position.

4. The device assembly of claim 1, wherein the post is insertable into the post receptacle along the longitudinal axis of the post such that the post is to anchor the retainer to the system board when disposed within the post receptacle.

5. The device assembly of claim 1, wherein the hook is to engage with the tail of the expansion card when disposed in the second position so as to retain the expansion card to the system board along a direction aligned with the longitudinal axis of the post.

6. A circuit board assembly, comprising:
an expansion slot disposed on a circuit board and having a board connector, the board connector to receive a complementary card connector of an expansion card in a connected position; and
a retainer disposed at a distal end of the expansion slot, the retainer comprising:
a post to anchor the retainer to the circuit board;
a collar rotatably engaged with the post; and
a hook hingeably attached to the collar and movable between a released position and a latched position.

7. The circuit board assembly of claim 6, wherein the retainer is to engage with a tail of the expansion card when disposed in the latched position so as to retain the card connector of the expansion card in the connected position within the board connector.

8. The circuit board assembly of claim 7, wherein the hook is to be disengaged from the tail of the expansion card when the hook is disposed in the released position such that the card connector is removable from the board connector.

9. The circuit board assembly of claim 8, wherein the retainer is threadably engaged with a post receptacle of the circuit board at the distal end of the expansion slot.

10. A computing device, comprising:
a circuit board assembly having a system board;
an expansion card;
an expansion slot operably disposed on the system board, the expansion slot to receive the expansion card; and
a retainer attached to the system hoard, the retainer to engage with a portion of an expansion card to retain the expansion card within the expansion slot and comprising:
a post to anchor the retainer to the system board; and
a hook hingeably engaged with the post through a rotatable collar and movable between a released position and a latched position.

11. The computing device of claim 10, further comprising a board substrate disposed on an opposite side of the system board from the expansion slot, the post to insertably engage with the hoard substrate to anchor the retainer to the system board.

12. The computing device of claim 11, wherein the post is to threadably engage with a boss of the board substrate to anchor the retainer to the system board.

13. The computing device of claim 10, wherein the expansion slot includes a board connector to receive a complementary card, connector of the expansion card, the expansion card to be operably engaged with the computing device when the card connector is fully engaged with the board connector.

14. The computing device of claim 13, wherein the expansion card further includes a tail disposed at a distal end of the card connector, the hook to latch on to the tail to retain the expansion card to the system board if the hook is disposed in the latched position and the card connector is fully engaged with the board connector.

* * * * *